(12) United States Patent
Kim et al.

(10) Patent No.: US 11,476,246 B2
(45) Date of Patent: Oct. 18, 2022

(54) DISPLAY DEVICE

(71) Applicant: Samsung Display Co., Ltd., Yongin-si (KR)

(72) Inventors: Dongwook Kim, Yongin-si (KR); Wonkyu Kwak, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/208,603

(22) Filed: Mar. 22, 2021

(65) Prior Publication Data

US 2021/0225834 A1 Jul. 22, 2021

Related U.S. Application Data

(62) Division of application No. 16/263,344, filed on Jan. 31, 2019, now Pat. No. 10,978,447.

(30) Foreign Application Priority Data

Jan. 31, 2018 (KR) ........................ 10-2018-0012025

(51) Int. Cl.
*H01L 27/02* (2006.01)
*H01L 27/32* (2006.01)
(Continued)

(52) U.S. Cl.
CPC ........ *H01L 27/0292* (2013.01); *G06F 3/0412* (2013.01); *G06F 3/04164* (2019.05); *G09G 3/3266* (2013.01); *G09G 3/3275* (2013.01); *H01L 27/323* (2013.01); *H01L 27/3246* (2013.01); *H01L 27/3272* (2013.01); *H01L 27/3276* (2013.01); *H01L 51/5228* (2013.01);
(Continued)

(58) Field of Classification Search
None
See application file for complete search history.

(56) References Cited

U.S. PATENT DOCUMENTS 7,166,966 B2  1/2007  Naugler, Jr. et al.
7,944,140 B2  5/2011  Kwak et al.
(Continued)

FOREIGN PATENT DOCUMENTS

KR  10-2007-0020431  2/2007
KR  10-0830331  5/2008
(Continued)

OTHER PUBLICATIONS

Extended European Search Report corresponding to European Patent Application or Patent No. 19154889.0 dated Jul. 5, 2019.

*Primary Examiner* — Duane N Taylor, Jr.
(74) *Attorney, Agent, or Firm* — Kile Park Reed & Houtteman PLLC

(57) ABSTRACT

A display device includes a substrate that includes a display area and a peripheral area outside the display area, a display element on the display area, a peripheral circuit on the peripheral area, the peripheral circuit including a thin film transistor, a first shielding layer on the peripheral circuit, and a second shielding layer on the first shielding layer. At least one of the first shielding layer and the second shielding layer includes a hole. One shielding layer of the first shielding
(Continued)

layer and the second shielding layer includes the hole and overlaps the other one of the first shielding layer and the second shielding layer.

13 Claims, 22 Drawing Sheets

(51) Int. Cl.
    *G06F 3/041*     (2006.01)
    *G09G 3/3266*     (2016.01)
    *G09G 3/3275*     (2016.01)
    *H01L 51/52*     (2006.01)
    *G06F 3/044*     (2006.01)
    *G02F 1/1345*     (2006.01)
    *G02F 1/1362*     (2006.01)

(52) U.S. Cl.
    CPC ...... *H01L 51/5246* (2013.01); *G02F 1/13452* (2013.01); *G02F 1/136204* (2013.01); *G06F 3/044* (2013.01); *G06F 3/0446* (2019.05); *G06F 2203/04107* (2013.01); *G09G 2310/0278* (2013.01); *G09G 2310/0297* (2013.01); *H01L 27/3223* (2013.01); *H01L 27/3258* (2013.01); *H01L 51/5225* (2013.01); *H01L 51/5237* (2013.01)

(56) References Cited

U.S. PATENT DOCUMENTS

| | | | |
|---|---|---|---|
| 10,088,727 B2 * | 10/2018 | Wada | H01L 29/42384 |
| 2008/0158453 A1 | 7/2008 | Segawa et al. | |
| 2011/0043495 A1 * | 2/2011 | Bang | H01L 27/3276 |
| | | | 345/204 |
| 2014/0332769 A1 | 11/2014 | Lee et al. | |
| 2015/0034921 A1 * | 2/2015 | Kim | H01L 27/3258 |
| | | | 438/34 |
| 2015/0102295 A1 * | 4/2015 | Hong | H01L 51/529 |
| | | | 438/23 |
| 2016/0299611 A1 | 10/2016 | Park | |
| 2016/0306472 A1 | 10/2016 | Park et al. | |
| 2017/0060310 A1 * | 3/2017 | Gwon | G09G 3/3677 |
| 2017/0192614 A1 | 7/2017 | Lee et al. | |
| 2018/0083087 A1 | 3/2018 | Choi | |

FOREIGN PATENT DOCUMENTS

| | | |
|---|---|---|
| KR | 10-2013-0031101 | 3/2013 |
| KR | 10-2016-0124319 | 10/2016 |

\* cited by examiner

DISPLAY DEVICE

CROSS-REFERENCE TO RELATED APPLICATION(S)

This is a divisional application of U.S. patent application Ser. No. 16/263,344 filed Jan. 31, 2019 (now issued as U.S. Pat. No. 10,845,687), the disclosure of which is incorporated herein by reference in its entirety. U.S. patent application Ser. No. 16/263,344 claims priority benefit of Korean Patent Application 10-2018-0012025 filed Jan. 31, 2018 in the Korean Intellectual Property Office, the disclosure of which is incorporated herein by reference in its entirety for all purposes.

BACKGROUND

1. Field

One or more embodiments relate to display devices.

2. Description of the Related Art

With the progress in the development of display devices which visually display electrical signals, display devices have been used for various purposes.

SUMMARY

Embodiments are directed to a display device including a substrate that includes a display area and a peripheral area outside the display area, a display element in the display area, a peripheral circuit in the peripheral area, the peripheral circuit including a thin film transistor, a first shielding layer on the peripheral circuit and a second shielding layer on the first shielding layer. At least one of the first shielding layer or the second shielding layer includes a hole. One shielding layer of the first shielding layer and the second shielding layer includes the hole and overlaps the other one of the first shielding layer and the second shielding layer.

The first shielding layer may include a first hole. The second shielding layer may include a second hole. A center of the first hole and a center of the second hole may be spaced apart from each other.

The first hole and the second hole may not overlap each other. The first hole may overlap a portion of the second shielding layer. The second hole may overlap a portion of the first shielding layer.

The display device may further include an organic insulating layer located under at least one of the first shielding layer or the second shielding layer.

The display device may further include an input sensor that includes sensing electrodes and signal lines. The sensing electrodes may be located in the display area. The signal lines may be located in the peripheral area and electrically connected to the sensing electrodes.

At least one of the signal lines may overlap the peripheral circuit.

The first shielding layer and the second shielding layer may be interposed between the at least one of the signal lines and the peripheral circuit.

At least one of the signal lines may include a first signal line portion and a second signal line portion that are electrically connected to each other via a contact hole.

An insulating layer including at least one of an organic insulating material or an inorganic insulating material may be interposed between the first signal line portion and the second signal line portion. The contact hole may be defined in the insulating layer.

The display element may include a pixel electrode, an emission layer, and an opposite electrode that are sequentially stacked. An end of the opposite electrode may extend towards the peripheral area.

At least one of the signal lines may be located in an area between the end of the opposite electrode and an outer edge of the substrate.

The first shielding layer and the second shielding layer may have a same voltage level.

Embodiments are also directed to a display device including a substrate that includes a display area and a peripheral area outside the display area, a display element including a pixel electrode electrically connected to a thin film transistor located in the display area, an input sensor including sensing electrodes and signal lines, wherein the sensing electrodes are located in the display area, and the signal lines are connected to the sensing electrodes and located in the peripheral area, a peripheral circuit in the peripheral area, and a first shielding layer and a second shielding layer each located in the peripheral area, the first shielding layer and the second shielding layer being interposed between the peripheral circuit and the signal lines.

The display device may further include a first insulating layer under the first shielding layer and a second insulating layer under the second shielding layer. The second insulating layer may be between the first shielding layer and the second shielding layer.

At least one of the first insulating layer or the second insulating layer may include an organic insulating material.

At least one of the first shielding layer or the second shielding layer may include a hole.

The hole of one shielding layer of the first shielding layer and the second shielding layer may overlap a portion of the other shielding layer.

The display element may further include an opposite electrode facing the pixel electrode. An end of the opposite electrode may extend to the peripheral area.

The end of the opposite electrode may cover the peripheral circuit.

At least one of the signal lines may be located in an area between the end of the opposite electrode and an outer edge of the substrate.

The display device may further include a first power voltage wiring located in the peripheral area and providing first power to the thin film transistor on the display area, and a second power voltage wiring located in the peripheral area and providing second power to the display element, the second power being different from the first power. The first shielding layer and the second shielding layer may be electrically connected to the first power voltage wiring or the second power voltage wiring.

The display device may further include an encapsulation member under the input sensors. The encapsulation member may cover the display element and the peripheral circuit.

The encapsulation member may include at least one inorganic encapsulation layer and at least one organic encapsulation layer.

The encapsulation member may include a sealant surrounding the display area and an encapsulation substrate facing the substrate, the sealant being interposed between the encapsulation substrate and the substrate.

The display device may further include at least one of a scan line, a data line, and a control line that are electrically connected to the thin film transistor. The peripheral circuit may be electrically connected to the at least one of the scan line, the data line, and the control line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
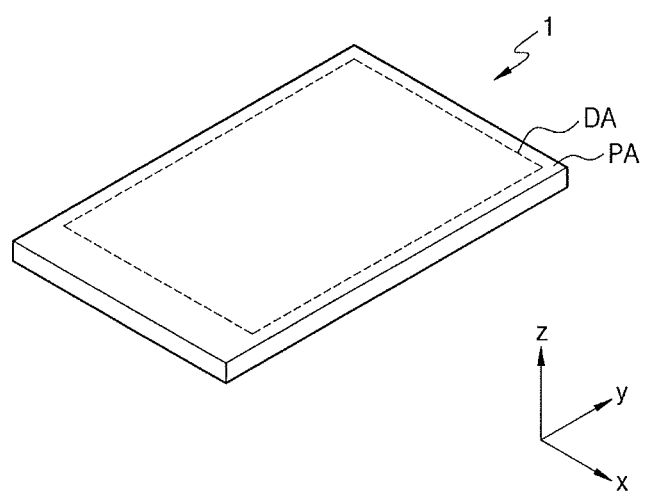
FIG. 1 illustrates a perspective view schematically illustrating a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Throughout the disclosure, the expression "at least one of 'a', 'b' or 'c'" indicates only 'a', only 'b', only 'c', both 'a' and 'b', both 'a' and 'c', both 'b' and 'c', all of 'a', 'b', and 'c', or variations thereof.

Referring to FIG. 1, the display device 1 includes a display area DA and a peripheral area PA outside the display area DA. The display device 1 may provide an image via the display area DA. The display device 1 may be a liquid crystal display, an electrophoretic display, an organic light-emitting display, an inorganic light-emitting display, a quantum dot light-emitting display, a field emission display, a surface-conduction electron-emitter display, a plasma display, a cathode ray display or the like.

Figure 2A:
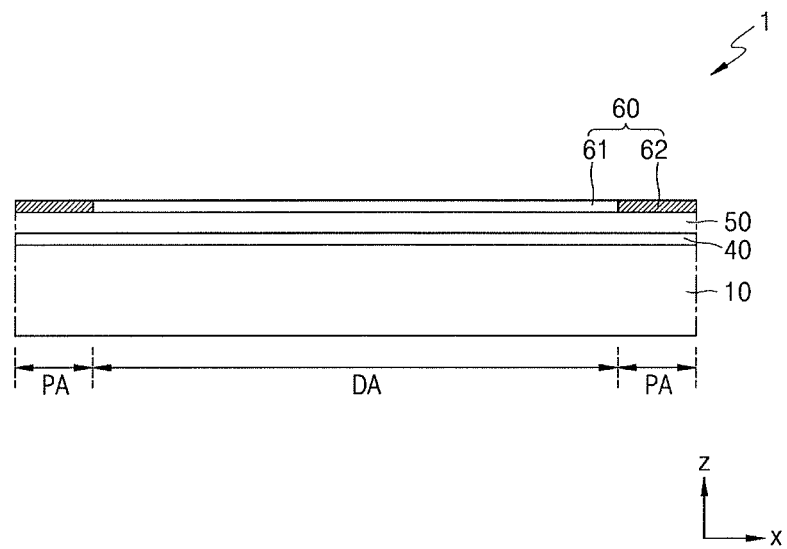
FIGS. 2A and 2B illustrate cross-sectional views of a display device according to embodiments.
Figure 2B:
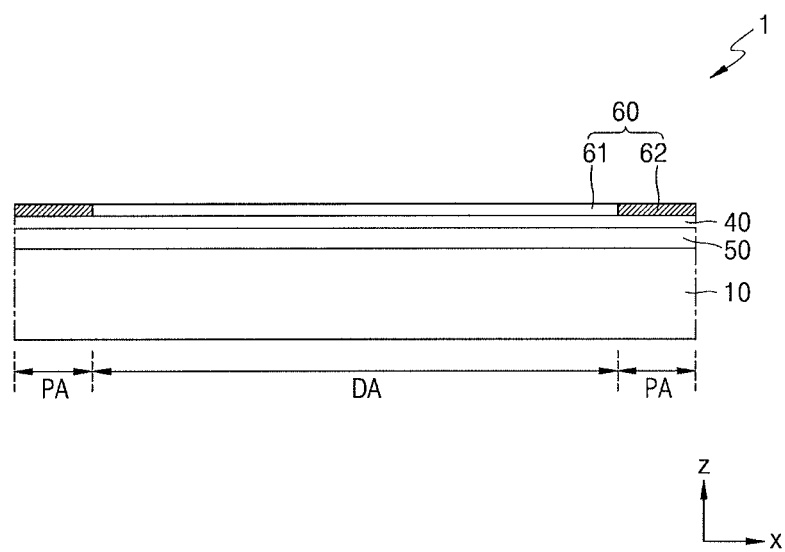

Hereinafter, an organic light-emitting display device will be described as an example of the display device 1 according to an embodiment FIGS. 2A and 2B illustrate cross-sectional views of a display device according to embodiments.

Referring to FIGS. 2A and 2B, the display device 1 may include a display unit (or display panel) 10, an input sensor 40, an anti-reflection layer 50, and a window 60.

The display 10 generates an image. The display 10 may generate a predetermined image by using red, green, blue or white light emitted from, for example, organic light-emitting diodes (OLEDs).

The input sensor 40 may acquire coordinate information according to an external input, for example, a touch event. The input sensor 40 may be arranged above the display 10 and under the anti-reflection layer 50, as illustrated in FIG. 2A, or above the anti-reflection layer 50, as illustrated in FIG. 2B. The input sensor 40 may include a sensing electrode (or touch electrode) and a signal line (trace line) connected to the sensing electrode.

According to an embodiment, the input sensor 40 may be disposed directly on the display unit 10. The description "input sensor 40 disposed directly on the display unit 10" indicates that no additional adhesive layer is interposed between the input sensor 40 and the display unit 10 and that elements of the input sensor 40 are directly patterned on the display unit 10. In some implementations, the input sensor 40 may be formed in a separate process from the display unit 10 and then combined to the display unit 10 by using an adhesive material layer or the like.

The anti-reflection layer 50 may reduce reflectivity of light incident from the outside onto the display unit 10 through the window 60. The anti-reflection layer 50 may be disposed on the input sensor 40 as illustrated in FIG. 2A or under the input sensor 40 as illustrated in FIG. 2B.

According to an embodiment, the anti-reflection layer 50 may include a polarizer, a phase retarder, or the like. In some implementations, the anti-reflection layer 50 may include a black matrix and a color filter. When the anti-reflection layer 50 includes a polarizer or the like, the polarizer may be relatively thick. In this case, the anti-reflection layer 50 may be attached to the display unit 10 or the input sensor 40 using an adhesive material layer or the like. When the anti-reflection layer 50 includes a black matrix and a color filter, the anti-reflection layer 50 may have a relatively small thickness. In this case, the anti-reflection layer 50 may be directly disposed on the display unit 10 or the input sensor 40.

The window 60 may include a light transmitting area 61 corresponding to the display area DA and a light shielding area 62 corresponding to the peripheral area PA.

Figure 3A:
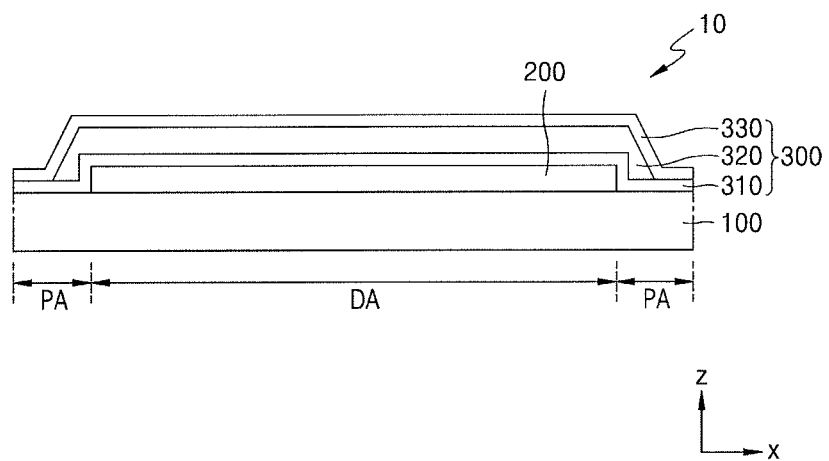
FIGS. 3A and 3B illustrate cross-sectional views schematically illustrating a display unit according to embodiments.
Figure 3B:
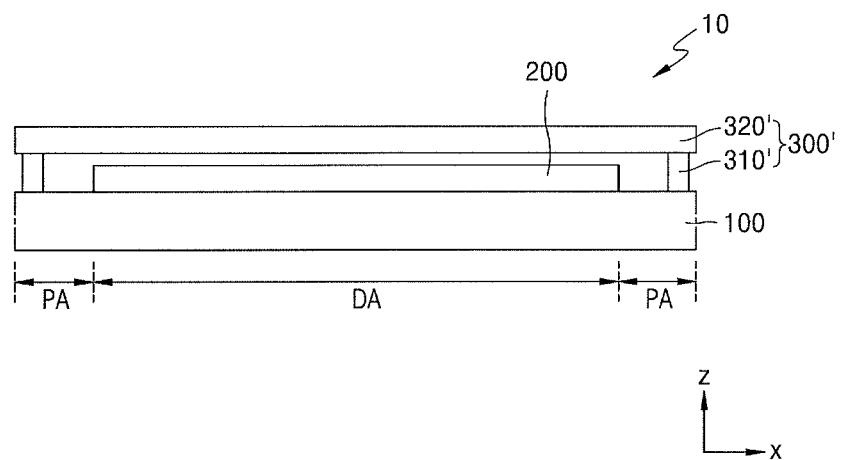

FIGS. 3A and 3B illustrate cross-sectional views schematically illustrating a display unit according to an embodiment.

Referring to FIG. 3A, the display unit 10 may include a display element layer 200 disposed on a substrate 100 and an encapsulation member 300 covering the display element layer 200.

The substrate 100 may include a polymer resin such as polyethersulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC) or cellulose acetate propionate (CAP). The substrate 100 maybe in a form of a single layer or may be a multi-layer structure of the above materials. In the case of a multi-layer structure, the substrate 100 may further include an inorganic layer. The substrate 100 may have flexible, rollable or bendable characteristics.

The display element layer 200 includes pixels. Each pixel may include an organic light-emitting diode and a pixel circuit electrically connected to the organic light-emitting diode. The pixel circuit may include a thin film transistor and a storage capacitor and lines connected thereto. The pixel circuit may also include one or more insulating layers.

The encapsulation member 300 may protect the display element layer 200 from external foreign substances such as moisture. The encapsulation member 300 may include a thin film encapsulation layer including at least one inorganic encapsulation layer and at least one organic encapsulation layer. The inorganic encapsulation layer may include, for example, a silicon oxide layer, a silicon nitride layer or/and a silicon oxynitride layer, a titanium oxide layer, an aluminum oxide layer, or the like. The organic encapsulation layer may include, for example, an acrylic based organic material.

While FIG. 3A illustrates that the encapsulation member 300, which is a thin film encapsulation layer, includes first and second inorganic encapsulation layers 310 and 330 and an organic encapsulation layer 320 interposed therebetween, in some implementations, the stacking order of inorganic encapsulation layers and organic encapsulation layers or the like may be varied. Also, the encapsulation member 300 may be other than a thin film encapsulation layer.

Referring to FIG. 3B, the display unit 10 may include an encapsulation member 300' including a sealant 310' and an encapsulation substrate 320'. The substrate 100 as illustrated in FIG. 3B may include the above-described polymer resin, or may include glass or the like.

The encapsulation substrate 320' may be disposed to face the substrate 100, and a sealant 310' may be disposed between the substrate 100 and the encapsulation substrate 320'. The sealant 310' may surround the display area DA. An inner space defined by the substrate 100, the encapsulation substrate 320', and the sealant 310' may be separated from the outer space and penetration of moisture or impurities thereinto may be reduced or prevented. The encapsulation substrate 320' may include the above-described polymer resin or glass or the like, and a material such as a frit or an epoxy may be used as the sealant 310'.

Figure 4:
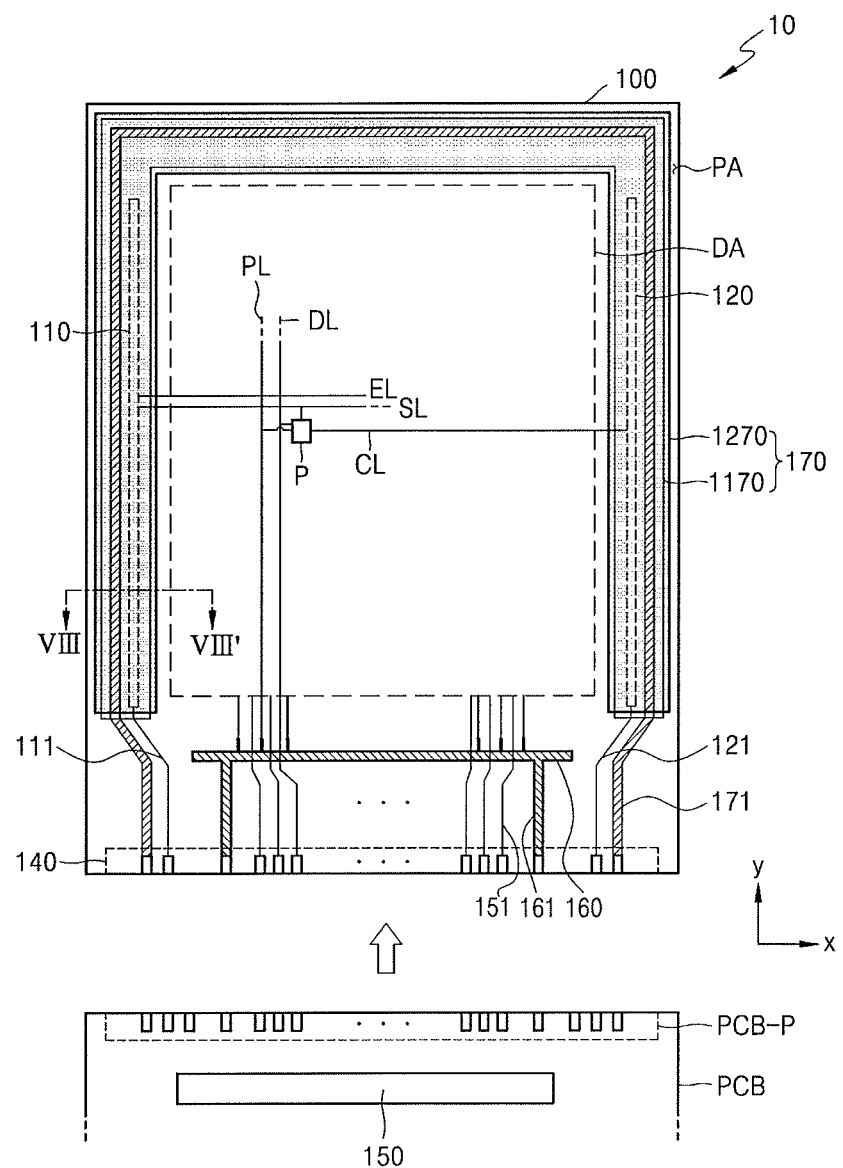
FIG. 4 illustrates a plan view illustrating a display unit according to an embodiment.
Figure 5:
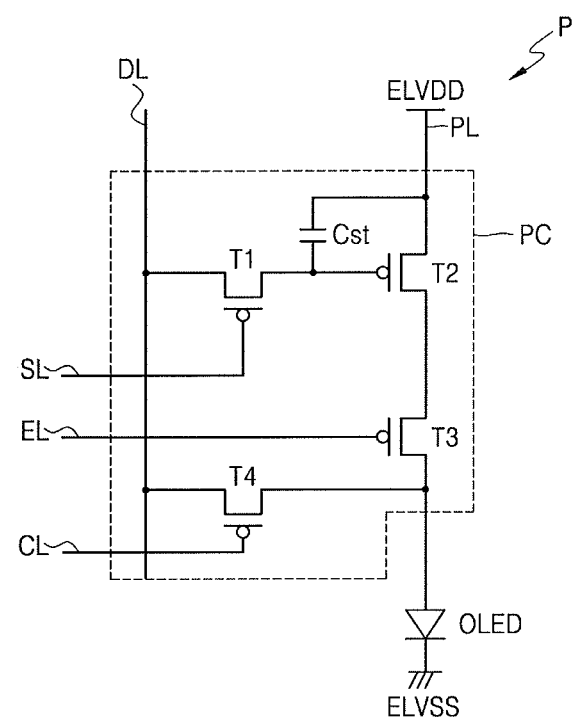
FIG. 5 illustrates an equivalent circuit diagram of a pixel according to an embodiment.

FIG. 4 illustrates a plan view of a display unit according to an embodiment, and FIG. 5 illustrates an equivalent circuit diagram of a pixel according to an embodiment.

Referring to FIG. 4, the display unit 10 may include pixels P arranged in the display area DA. The pixels P may include a pixel circuit PC and an organic light-emitting diode OLED connected to the pixel circuit PC, as illustrated in FIG. 5. A pixel electrode (e.g., an anode) of the organic light-emitting diode OLED may be connected to the pixel circuit PC. An opposite electrode (e.g., a cathode) of the organic light-emitting diode OLED may be connected to a second power ELVSS. The organic light-emitting diode OLED may emit light of a predetermined luminance based on a current supplied from the pixel circuit PC.

The pixel circuit PC may include a thin film transistor and a capacitor. The pixel circuit PC may include first through fourth thin film transistors T1, T2, T3, and T4 and a storage capacitor Cst, as illustrated in FIG. 5.

A gate electrode of the first thin film transistor T1 may be connected to a scan line SL. A first electrode of the first thin film transistor T1 may be connected to a data line DL, and a second electrode of the first thin film transistor T1 may be connected to the storage capacitor Cst. The first thin film transistor T1 may be turned on when a scan signal is supplied to the scan line SL.

A gate electrode of the second thin film transistor T2 may be connected to the storage capacitor Cst. A first electrode of the second thin film transistor T2 may be connected to the storage capacitor Cst and a first power ELVDD. The second thin film transistor T2 may control an amount of current flowing from the first power ELVDD to the second power ELVSS via the organic light-emitting diode OLED in response to a voltage value stored in the storage capacitor Cst. The organic light-emitting diode OLED may generate light corresponding to the amount of current supplied from the second thin film transistor T2.

A gate electrode of the third thin film transistor T3 may be connected to an emission control line EL. A first electrode of the third thin film transistor T3 may be connected to a second electrode of the second thin film transistor T2, and a second electrode of the third thin film transistor T3 may be connected to the organic light-emitting diode OLED. The third thin film transistor T3 may be turned off when an emission control signal is supplied to the emission control line EL and may be turned on when no emission control signal is supplied. The emission control signal may be supplied during a period during which a voltage corresponding to a data signal is charged in the storage capacitor Cst and during a period during which deterioration information of the organic light-emitting diode OLED is sensed.

The fourth thin film transistor T4 may be a sensing transistor and may be turned on during a period of a current sensing operation of the organic light-emitting diode OLED. A gate electrode of the fourth thin film transistor T4 may be connected to a control line CL. A first electrode of the fourth thin film transistor T4 may be connected to the second electrode of the third thin film transistor T3. A second electrode of the fourth thin film transistor T4 may be connected to the data line DL. The fourth thin film transistor T4 may be turned on when a control signal is supplied to the control line CL, and may be turned off otherwise. A control signal may be supplied during a period during which deterioration information of the organic light-emitting diode OLED is sensed.

FIG. 5 illustrates an embodiment in which the pixel P includes four thin film transistors and one storage capacitor In some implementations, the pixel circuit PC may be include two, three or five or more thin film transistors or include two or more storage capacitors.

Referring back to FIG. 4, the peripheral area PA of the display unit 10 may surround the display area DA. The peripheral area PA may correspond to a non-display area that does not provide an image.

A scan driving circuit 110 as a first peripheral circuit, a control driving circuit 120 as a second peripheral circuit, a terminal 140, a first power supply wiring (or a first power voltage wiring) 160, and a second power supply wiring (or a second power voltage wiring) 170 may be disposed in the peripheral area PA.

The scan driving circuit 110 may be disposed on the peripheral area PA of the substrate 100. The scan driving circuit 110 may be electrically connected to the scan line SL and may supply a predetermined scan signal to the scan line SL. According to an embodiment, when the pixel P includes the third thin film transistor T3 that corresponds to an emission control thin film transistor as described with reference to FIG. 5, the scan driving circuit 110 may supply an emission control signal to the emission control line EL.

The control driving circuit 120 may be disposed on the peripheral area PA of the substrate 100. The scan driving circuit 110 and the control driving circuit 120 may be arranged in parallel with each other with the display area DA therebetween. The scan driving circuit 110 may be disposed at a first side of the display area DA, and the control driving circuit 120 may be disposed at a second side of the display area DA opposite to the first side.

The terminal 140 may be disposed at one end of the substrate 100. The terminal 140 may not be covered by an insulating layer but be exposed and electrically connected to a printed circuit board PCB. The terminal 140 may be disposed on a side of the peripheral area PA where the scan driving circuit 110 and the control driving circuit 120 are not located. For example, the terminal 140 may be disposed in parallel with a third side of the display area DA. Terminal 140 may be connected to the scan driving circuit 110 via line 111. Terminal 140 also may be connected to the control driving circuit 120 via line 112.

A terminal PCB-P of the printed circuit board PCB may be electrically connected to the terminal 140 of the display unit 10. The printed circuit board PCB may provide a signal of a controller or may provide power to the display unit 10. Control signals generated in the controller may be transmitted to each of the scan driving circuit 110 (using line 111) and the control driving circuit 120 (using line 112) via the printed circuit board PCB. The controller may respectively provide the first power ELVDD and the second power ELVSS (see FIG. 5) to the first and second power supply wirings 160 and 170 through first and second connection wirings 161 and 171. The first power ELVDD may be provided to each of the pixels P through a driving voltage line PL connected to the first power supply wiring 160, and the second power ELVSS may be provided to opposite electrodes of the pixels P connected to the second power supply wiring 170.

The data driving circuit 150 may be electrically connected to the data line DL. A data signal of the data driving circuit 150 may be provided to each pixel P through a wiring 151 connected to the terminal 140 and a data line DL connected to the wiring 151. The data driving circuit 150 may be disposed on the printed circuit board PCB, as illustrated in FIG. 4. In some implementations, the data driving circuit 150 may be disposed on the substrate 100. For example, the data driving circuit 150 may be disposed between the terminal 140 and the first power supply wiring 160 illustrated in FIG. 4.

The first power supply wiring 160 and the second power supply wiring 170 may be disposed in the peripheral area PA. The first power supply wiring 160 may be disposed adjacent to the third side of the display unit 10. The second power supply wiring 170 may partially surround the display area DA along an edge of the display area DA. For example, the second power supply wiring 170 may have the form of an incomplete loop in which one side is open.

The second power supply wiring 170 may be connected to the second connection wiring 171 that is connected to the terminal 140. The second connection wiring 171 may have the form of an incomplete loop extending to partially surround the display area DA and being open at one side. FIG. 4 illustrates that, like the second power supply wiring 170, the second connection wiring 171 may extend along a first side (left side in FIG. 4), a fourth side (upper side in FIG. 4), and a second side (right side in FIG. 4) of the display area DA. In some implementations, the second connection wiring 171 may be connected only to an end of the second power supply wiring 170. For example, a pair of second connection wirings 171 may be each connected to both ends of the second power supply wiring 170 adjacent to the third side of the display area DA.

Figure 6A:
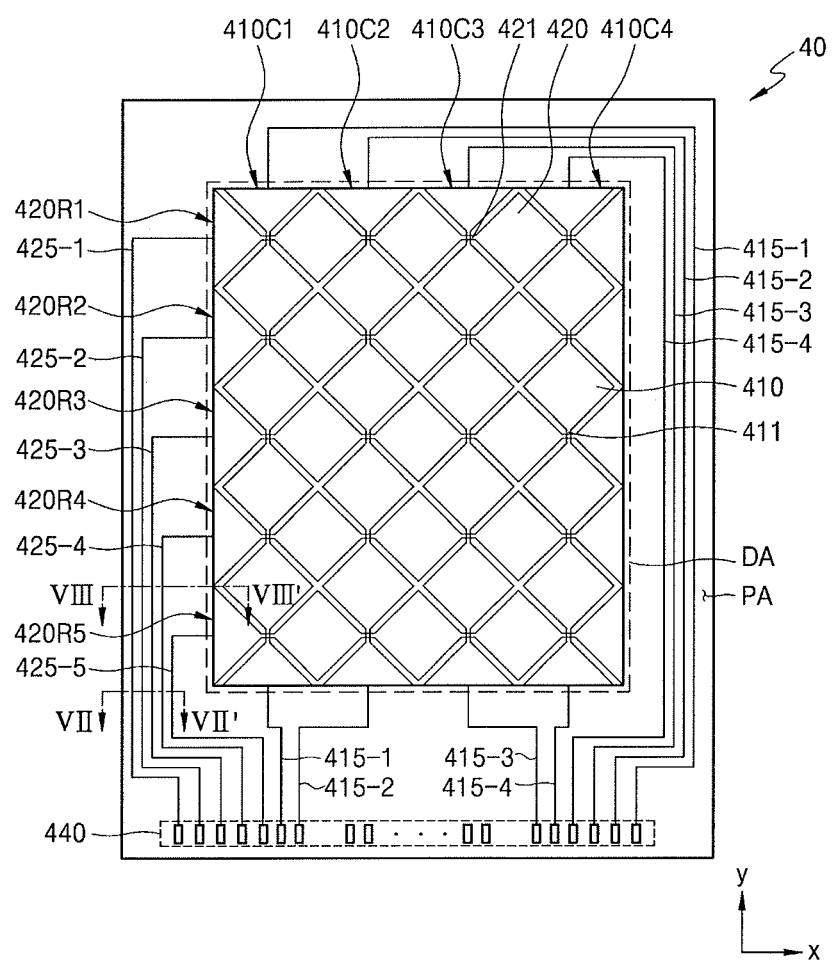
FIGS. 6A through 6C illustrate plan views schematically illustrating an input sensor according to embodiments.
Figure 6B:
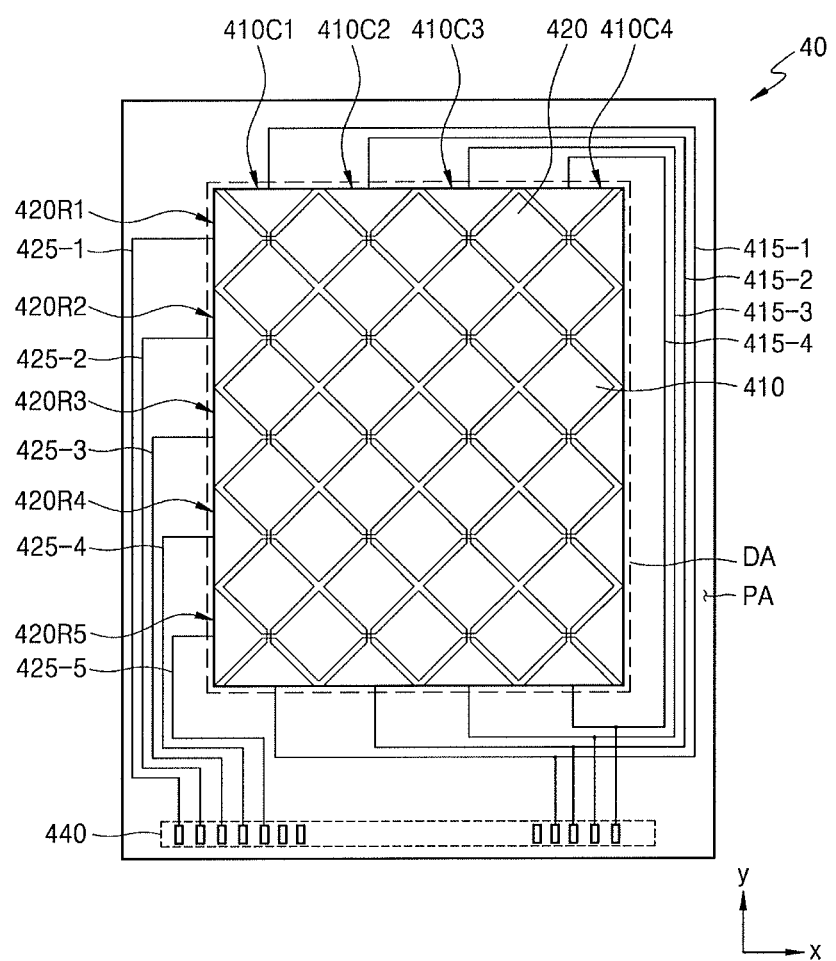
Figure 6C:
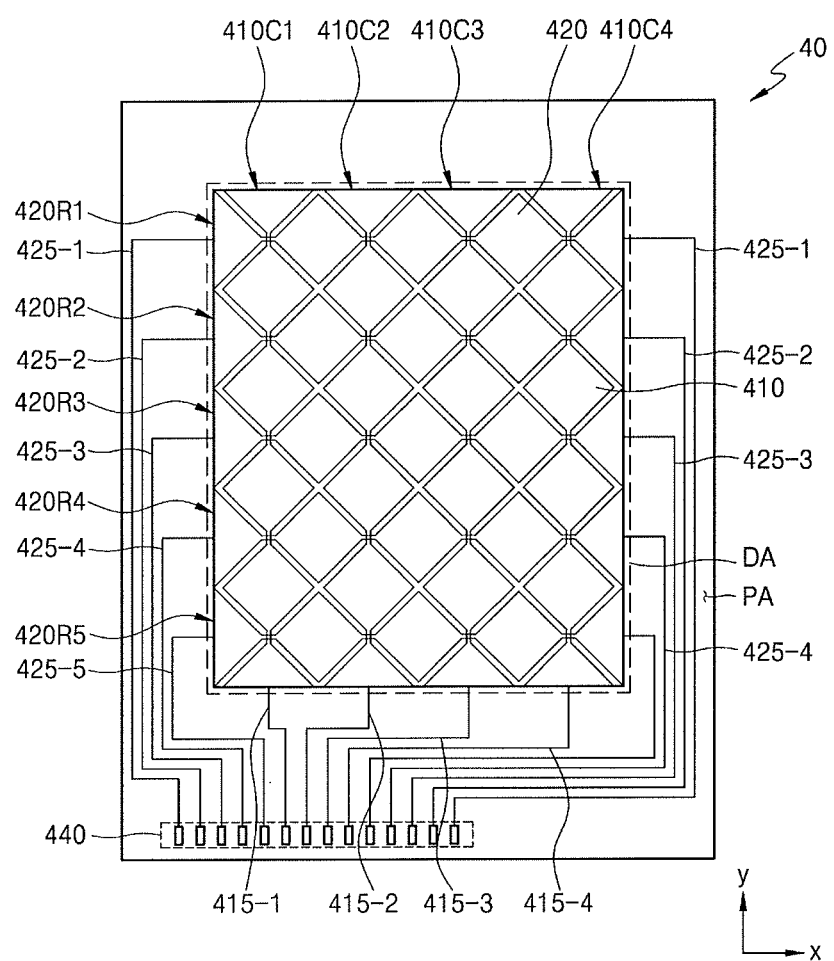

FIGS. 6A through 6C illustrates plan views schematically depicting the input sensor 40 according to embodiments.

Referring to FIG. 6A, the input sensor 40 may include first sensing electrodes 410, first signal lines 415-1 through 415-4 connected to the first sensing electrodes 410, second sensing electrodes 420, and second signal lines 425-1 through 425-5 connected to the second electrodes 420. The input sensor 40 may sense an external input by using a mutual capacitance method or/and a self capacitance method.

The first sensing electrodes 410 may be arranged in a y-direction, and the second sensing electrodes 420 may be arranged in an x-direction crossing the y-direction. The first sensing electrodes 410 arranged along the y-direction may respectively form first sensing lines 410C1 through 410C4 by connecting through a first connection electrode 411, and the second sensing electrodes 420 arranged along the x-direction may respectively form second sensing lines 420R1 through 420R5 by connecting through a second connection electrode 421. The first sensing lines 410C1 through 410C4 and the second sensing lines 420R1 through 420R5 may intersect each other. For example, the first sensing lines 410C1 through 410C4 and the second sensing lines 420R1 through 420R5 may be perpendicular to each other.

The first sensing lines 410C1 through 410C4 and the second sensing lines 420R1 through 420R5 may be disposed on the display area DA and may be connected to a sensing signal pad 440 via the first and second signal lines 415-1 through 415-4 and 425-1 through 425-5 in the peripheral area PA. The first sensing lines 410C1 through 410C4 may be respectively connected to the first signal lines 415-1 through 415-4, and the second sensing lines 420R1 through 420R5 may be respectively connected to the second signal lines 425-1 through 425-5.

The first signal lines 415-1 through 415-4 may each be connected to both an upper portion and a lower portion of the first sensing lines 410C1 through 410C4, respectively, as illustrated in FIG. 6A. Sensing sensitivity may be increased according to this structure. In some implementations, the first signal lines 415-1 through 415-4 may be connected to either the upper portion or the lower portion of the first sensing lines 410C1 through 410C4. In some implementations, each of the first signal lines 415-1 through 415-4 may be simultaneously connected to both the upper and lower portions of the first sensing lines 410C1 through 410C4, respectively, while also connected to the sensing signal pad 440, as illustrated in FIG. 6B. In some implementations, each of the second sensing lines 420R1 through 420R5 may be connected to the second signal lines 425-1 to 425-5 that are respectively provided on the left and right sides, as illustrated in FIG. 6C. A layout of the first and second signal lines 415-1 to 415-4 and 425-1 through 425-5 may be provided in the peripheral area PA. In some implementations, the layout may be modified in according to the shape or size of the display area DA or a sensing method of the input sensor 40.

Figure 7A:
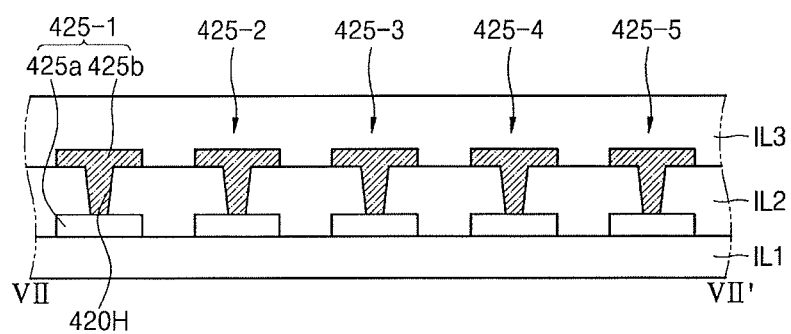
FIGS. 7A and 7B illustrate schematic cross-sectional views of a second signal line.
Figure 7B:
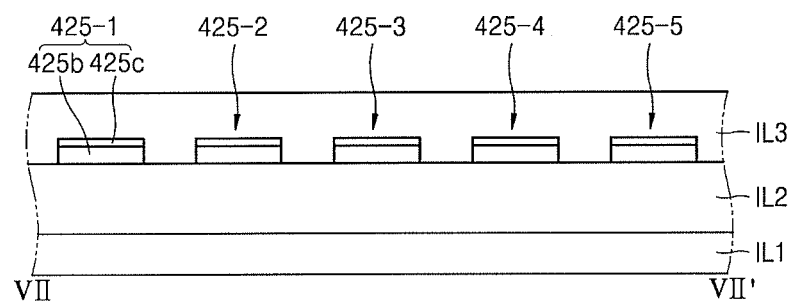

FIGS. 7A and 7B illustrate schematic cross-sectional views corresponding to line VII-VII' of FIG. 6A and depicting the second signal lines 425-1 through 425-5, The first signal lines 415-1 through 415-4 may have the same cross-sectional structure as that of the second signal lines 425-1 through 425-5. FIGS. 7A and 7B illustrate five second signal lines 425-1 through 425-5 as an example.

Referring to one second signal line 425-1 illustrated in FIG. 7A, the second signal line 425-1 may include a first signal line portion 425a and a second signal line portion 425b. The first and second signal line portions 425a and 425b may be overlap with each other between insulating layers ILL IL2, and IL3, and may be connected through a contact hole 420H to reduce resistance. According to an embodiment, in the second signal line 425-1, one of the first and second signal line portions 425a and 425b that are formed on a different layer with the insulating layer 420 included therebetween in FIG. 7A may be omitted. For example, as illustrated in FIG. 7B, the second signal line 425-1 may include a second signal line portion 425b, and may further include a third signal line portion 425c thereon. The second signal line 425-1 may be a conductive multi-layer in which, for example, a transparent conductive layer is disposed on the metal layer. According to an embodiment, the second signal line 425-1 may be a single layer.

Figure 8:
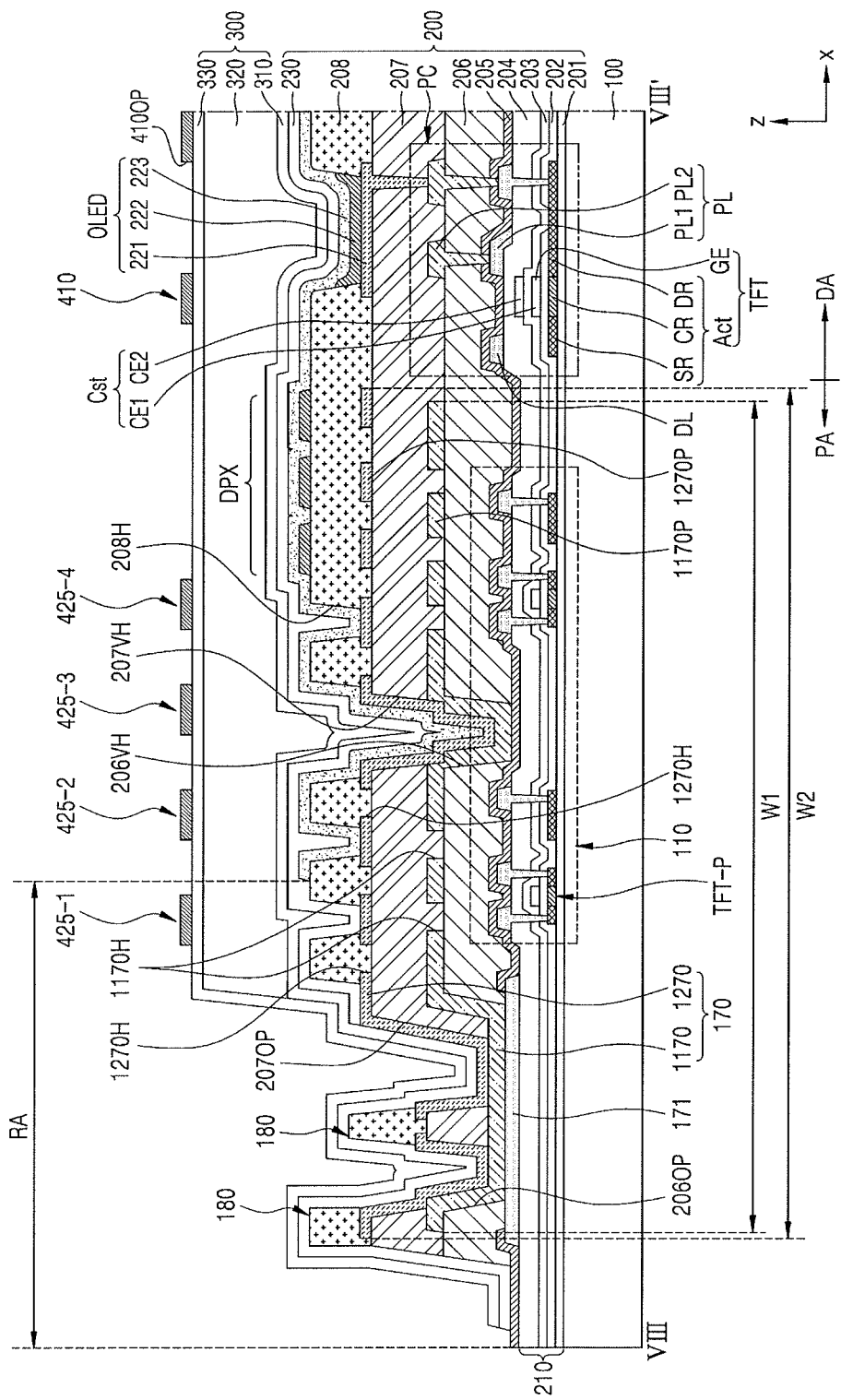
FIG. 8 illustrates a cross-sectional view illustrating a display device according to an embodiment, in which a display unit and an input sensor overlap each other.
Figure 9A:
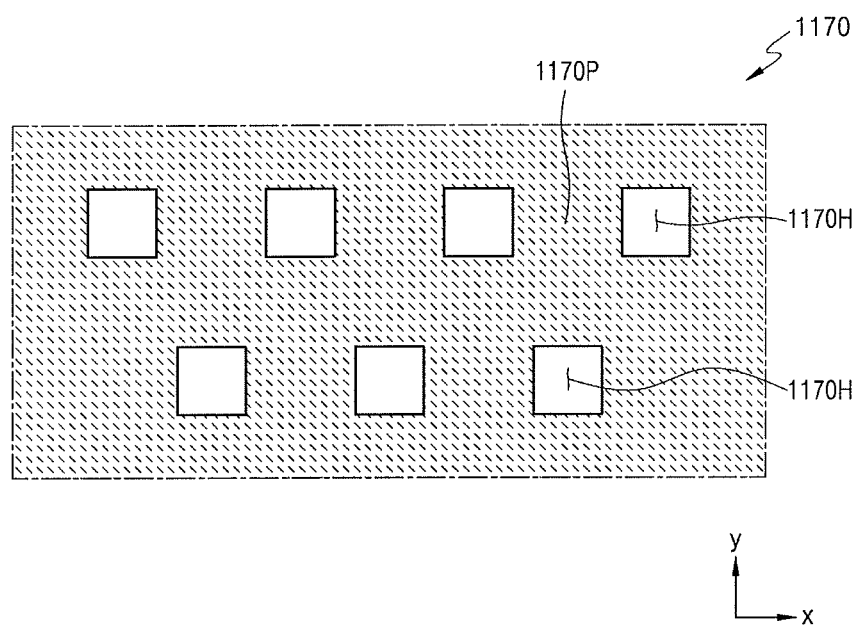
FIGS. 9A and 9B illustrate respectively partial plan views illustrating a first shielding layer and a second shielding layer of FIG. 8.
Figure 9B:
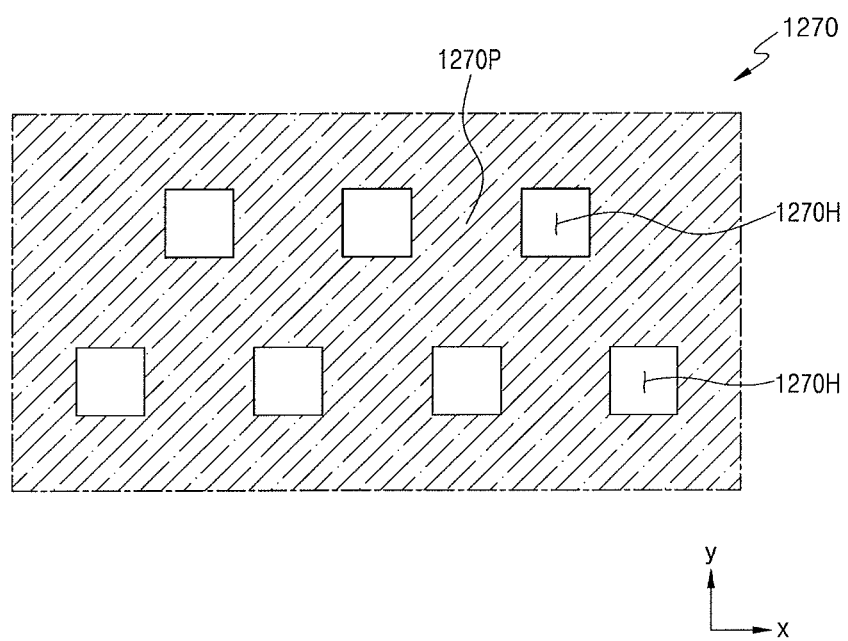
Figure 9C:
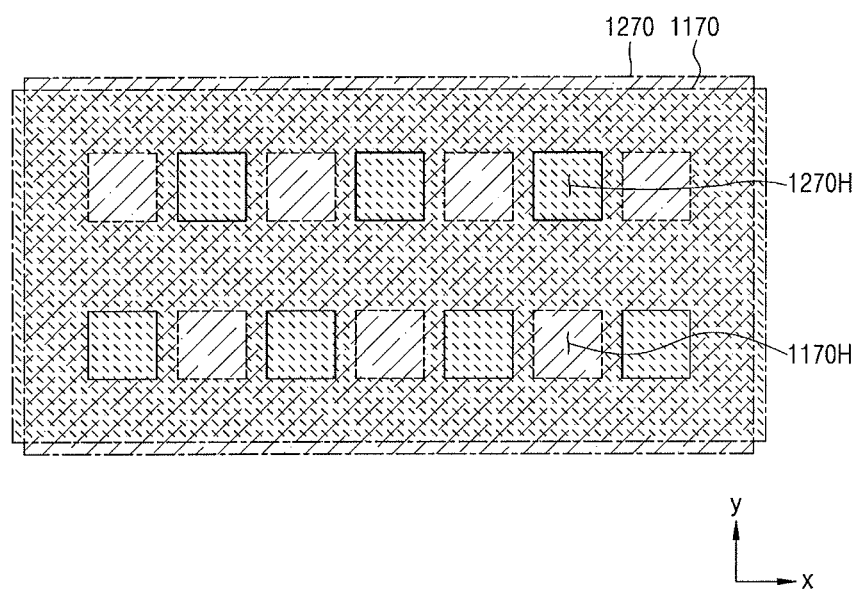
FIG. 9C illustrates a plan view illustrating a state where the first and second shielding layers overlap each other.

FIG. 8 illustrates a cross-sectional view of a display device according to an embodiment, in which a display unit and an input sensor overlap each other. FIG. 9A and FIG. 9B respectively illustrate partial plan views depicting first and second shielding layers of FIG. 8. FIG. 9C illustrate a plan view depicting a state in which the first and second shielding layers overlap each other. FIG. 8 corresponds to a cross-section taken along line VIII-VIII' of FIG. 4 and FIG. 6A.

Referring to the display area DA of FIG. 8, the display element layer 200 and the encapsulation member 300 may be disposed on the substrate 100.

A buffer layer 201 may be formed on the substrate 100. The buffer layer 201 may block penetration of foreign substances or moisture through the substrate 100. The buffer layer 201 may include, for example, an inorganic material such as silicon oxide, silicon nitride, and/or silicon oxynitride, and may be formed as a single layer or as a multilayer.

A thin film transistor TFT, a storage capacitor Cst, and an organic light-emitting diode OLED that is electrically connected to these elements may be disposed on the substrate 100. The thin film transistor TFT may include a semiconductor layer Act and a gate electrode GE. The semiconductor layer Act may include polysilicon, amorphous silicon, an oxide semiconductor, an organic semiconductor material or the like. In an embodiment, the semiconductor layer Act may include a channel region CR overlapping the gate electrode GE and a source region CR and a drain region DR that are on opposite sides of the channel region CR and include an impurity having a higher concentration than the channel region CR. The impurity may include an N-type impurity or a P-type impurity. The source region SR and the drain region DR may be respectively understood as a source electrode and a drain electrode of the thin film transistor TFT.

A gate insulating layer 202 may be disposed between the semiconductor layer Act and the gate electrode GE. The gate insulating layer 202 may be an inorganic layer such as silicon oxynitride, silicon oxide and/or silicon nitride, and the inorganic layer may be a single layer or a multilayer.

The storage capacitor Cst may include first and second storage capacitor plates CE1 and CE2 overlapping each other. A first interlayer insulating layer 203 may be disposed between the first and second storage capacitor plates CE1 and CE2. The first interlayer insulating layer 203 may have a predetermined permittivity. The first interlayer insulating layer 203 may be an inorganic layer such as silicon oxynitride (SiON), silicon oxide ($SiO_x$), and/or silicon nitride ($SiN_x$), and may be in a form of a single layer or a multilayer. In some implementations, the storage capacitor Cst may overlap the thin film transistor TFT and the first storage capacitor plate CE1 may also be the gate electrode GE of the thin film transistor TFT, as illustrated in FIG. 8. In some implementations, the storage capacitor Cst may not overlap with the thin film transistor TFT. Instead, the first storage capacitor plate CE1 may be a separate independent component from the gate electrode GE of the thin film transistor TFT.

The storage capacitor Cst may be covered by the second interlayer insulating layer 204. The second interlayer insulating layer 204 may be an inorganic layer such as silicon oxynitride, silicon oxide, and/or silicon nitride, and may be in a form of a single layer or a multilayer.

A driving voltage line PL may include a first driving voltage line PL1 and a second driving voltage line PL2. The first driving voltage line PL1 may include a same material as the data line DL. For example, the first driving voltage line PL1 and the data line DL may include aluminum (Al), copper (Cu), titanium (Ti) or the like, and may be formed as a multilayer or single layer. In an embodiment, the first driving voltage line PL1 and the data line DL may have a multilayer structure of Ti/Al/Ti.

The second driving voltage line PL2 may be disposed on the first driving voltage line PL1 with the first insulating layer 206 therebetween. The second driving voltage line PL2 may be electrically connected to the first driving voltage line PL1 through a contact hole defined in the first insulating layer 206. The second driving voltage line PL2 may include aluminum (Al), copper (Cu), titanium (Ti) or the like, and may be formed as a multilayer or a single layer. In an embodiment, the second driving voltage line PL2 may have a multilayer structure of Ti/Al/Ti. The first insulating layer 206 may include an organic insulating material such as, for example, an imide-based polymer, a general-purpose polymer such as polymethylmethacrylate (PMMA) or polystyrene (PS), a polymer derivative having a phenolic group, an acrylic polymer, an aryl-ether based polymer, an amide-based polymer, a fluorine-based polymer, a p-xylene-based polymer, a vinyl alcohol-based polymer, or blends thereof. For example, the first insulating layer 206 may include polyimide.

The driving voltage line PL may be covered by the second insulating layer 207. The second insulating layer 207 may include an organic insulating material. For example, the second insulating layer 207 may include an imide-based polymer, polymethylmethacrylate (PMMA) or polystyrene (PS), a polymer derivative having a phenolic group, an acrylic polymer, an aryl-ether based polymer, an amide-based polymer, a fluorine-based polymer, a p-xylene-based polymer, a vinyl alcohol-based polymer, and blends thereof. According to an embodiment, the second insulating layer 207 may include polyimide.

A pixel electrode 221 may be disposed on the second insulating layer 207. A pixel defining layer 208 may be disposed on the pixel electrode 221. The pixel defining layer 208 may have an opening corresponding to each pixel, for example, an opening exposing a portion of the pixel electrode 221 to thereby define each pixel. In addition, the pixel defining layer 208 may increase a distance between an edge of the pixel electrode 221 and the opposite electrode 223 to thereby prevent an arc or the like between the edge of the pixel electrode 221 and the opposite electrode 223. The pixel defining layer 208 may be formed of an organic material such as polyimide or hexamethyldisiloxane (HMDSO).

The intermediate layer 222 may include a low molecular material or a polymer material.

When the intermediate layer 222 includes a low molecular material, the intermediate layer 222 may have a structure in which a hole injection layer (HIL), a hole transport layer (HTL), an emission layer (EML), an electron transport layer (ETL), an electron injection layer (EIL) or the like are stacked in a single structure or in a composite structure. The intermediate layer 222 may include various organic materials such as copper phthalocyanine (CuPc), N,N-di(naphthalene-N, N'-diphenyl-benzidine) (NPB), or tris-8-hydroxyquinoline aluminum (Alq3). These layers may be formed using a vacuum deposition method.

When the intermediate layer 222 includes a polymer material, the intermediate layer 222 may typically have a structure including a hole transport layer (HTL) and an emission layer (EML). The hole transport layer may include PEDOT, and the emission layer may include a polymer material such as a poly-phenylenevinylene (PPV)-based material and a polyfluorene-based material. The intermediate layer 222 may have various structures. For example, at least one of the layers of the intermediate layer 222 may be integrally formed over a plurality of pixel electrodes 221. In some implementations, the intermediate layer 222 may include layers that are patterned to respectively correspond to the plurality of pixel electrodes 221.

The opposite electrode 223 may be disposed above the display area DA and may be arranged to cover the display area DA. For example, the opposite electrode 223 may be integrally formed to cover a plurality of pixels.

The encapsulation member 300 may be, for example, a thin film encapsulation layer. The encapsulation member 300 may cover the organic light-emitting diode OLED and may prevent damage that could occur due to moisture or oxygen penetrating from the outside. The thin film encapsulation layer may cover the display area DA and extend to the outside of the display area DA. The thin film encapsulation layer may include at least one inorganic encapsulation layer and at least one organic encapsulation layer. FIG. 8 illustrates an embodiment in which the thin film encapsulation layer includes a first inorganic encapsulation layer 310, an organic encapsulation layer 320, and a second inorganic encapsulation layer 330.

A plurality of layers including a capping layer 230 may be interposed between the first inorganic encapsulation layer 310 and the opposite electrode 223. While FIG. 8 illustrates that the capping layer 230 is provided, according to some implementations, the capping layer 230 may be omitted. When the capping layer 230 is omitted, the first inorganic encapsulation layer 310 may include at least two silicon oxynitride (SiON) layers having different properties.

The first inorganic encapsulation layer 310 may be formed along the elements formed under the same. Accordingly, the first inorganic encapsulation layer 310 may have an uneven top surface. The organic encapsulation layer 320 may cover the first inorganic encapsulation layer 310. Unlike the top surface of the first inorganic encapsulation layer 310, a top surface of the organic encapsulation layer 320 may be substantially flat. For example, the top surface of the organic encapsulation layer 320 may be substantially flat in a portion corresponding to the display area DA.

A sensing electrode may be disposed on the encapsulation member 300. In this regard, FIG. 8 schematically illustrates the first sensing electrode 410 on the encapsulation member 300. An insulating layer may be further disposed below and above the first sensing electrode 410 in FIG. 8. In some implementations, the first sensing electrode 410 may include multiple layers. The first sensing electrode 410 may include an opening 410OP corresponding to a light-emitting region of the organic light-emitting diode OLED such that light of the organic light-emitting diode OLED may be emitted to the outside.

Referring to the peripheral area PA of FIG. 8, an inorganic insulating layer 210 may be disposed on the substrate 100. The inorganic insulating layer 210 may include at least one of the buffer layer 201, the gate insulating layer 202, the first interlayer insulating layers 203 or the second interlayer insulating layers 204 described above. A second connection wiring 171 may be disposed on the inorganic insulating layer 210. The second connection wiring 171 may include a same material as the data line DL and/or the first driving voltage line PL1, and may be disposed on a same level as the data line DL and/or the first driving voltage line PL1.

The scan driving circuit 110 may be disposed on the substrate 100. The scan driving circuit 110 may include thin film transistors TFT-P and may include a wiring connected to the thin film transistors TFT-P. The thin film transistors TFT-P may be formed in the same process as the thin film transistor TFT of the pixel circuit PC. The scan driving circuit 110 may include an insulating layer interposed between the elements of the thin film transistors TFT-P (for example, a semiconductor layer, a gate electrode, etc.). In an implementation, the scan driving circuit 110 may be covered by an inorganic protection layer 205.

The scan driving circuit 110 may overlap a first shielding layer 1170 and a second shielding layer 1270 disposed above the scan driving circuit 110. The first shielding layer 1170 may be disposed above the scan driving circuit 110 with the first insulating layer 206 therebetween, and the second shielding layer 1270 may be disposed above the first shielding layer 1170 with the second insulating layer 207 therebetween. The first shielding layer 1170 may be disposed on a same level as and include a same material as the second driving voltage line PL2. The second shielding layer 1270 may be disposed on a same level as and include a same material as the pixel electrode 221.

A first width W1 of the first shielding layer 1170 and a second width W2 of the second shielding layer 1270 may be equal to or greater than a width of the scan driving circuit 110, as shown in FIG. 8.

At least one of the first shielding layer 1170 or the second shielding layer 1270 may include a hole. One shielding layer of the first and second shielding layers 1170 and 1270 may includes a hole that overlaps the other shielding layer.

In an embodiment, the first shielding layer 1170 may include first holes 1170H as illustrated in FIGS. 8 and 9A. The first holes 1170H may be spaced apart from one another on a plane. The second shielding layer 1270 may include second holes 1270H as illustrated in FIGS. 8 and 9B. The second holes 1270H may be spaced apart from each other on a plane. Each of the first and second holes 1170H and 1270H may be an outgassing passage of the first and second insulating layers 206 and 207, which are disposed under the first and second shielding layers 1170 and 1270. Accordingly, issues that may arise when the first and second holes 1170H and 1270H are not included, such as, for example, damage to the first and second shielding layers 1170 and 1270 or to the organic light-emitting diode OLED by gas in the first and second insulating layers 206 and 207 may be prevented or minimized.

The first holes 1170H and the second holes 1270H may be arranged to be offset from each other in a plan view. As illustrated in FIGS. 8 and 9C, a center of the first hole 1170H and a center of the second hole 1270H may be offset from each other and not coincident with each other. The first hole 1170H and the second hole 1270H may not overlap each other in a plan view. The first hole 1170H of the first shielding layer 1170 may overlap with a portion 1270P of the second shielding layer 1270, and the second hole 1270H of the second shielding layer 1270 may overlap with a portion1170P of the first shielding layer 1170. In the present specification, the term "a portion of a shielding layer" refers to an area with no hole, formed of a same material for forming the shielding layer. Accordingly, the portion 1170P of the first shielding layer 1170 may be regarded as a portion of the first shielding layer 1170 except where the first holes 1170H are located, and the portion 1270P of the second shielding layer 1270 may be regarded as a portion of the second shielding layer 1270 except where the second holes 1270H are located.

As described above, when one shielding layer that includes a hole overlapping a portion of the other shielding layer, when projected in a direction (z direction) perpendicular to a main surface of the substrate 100, and where a hole in one shielding layer does not overlap any hole in the other shielding layer in a plan view (looking at the display device from the z direction), the scan driving circuit 110 may be entirely covered by the first and second shielding layers 1170 and 1270. Damage to the scan driving circuit 110 that could occur due to external electrostatic discharge (ESD) may be prevented by the first and second shielding layers 1170 and 1270.

The first and second shielding layers 1170 and 1270 may have a same voltage level. Referring to FIG. 8, the first and second shielding layers 1170 and 1270 may be electrically connected to the second connection wiring 171. The first shielding layer 1170 may contact the second connection wiring 171 through an opening 206OP of the first insulating layer 206 that exposes the second connection wiring 171. The second shielding layer 1270 may contact the first shielding layer 1170 through an opening 207OP of the second insulating layer 207. The first and second shielding layers 1170 and 1270 electrically connected to the second connection wiring 171 may form a second power supply wiring 170.

The opposite electrode 223 may be connected to the second shielding layer 1270. Accordingly, the second power ELVSS (see, for example, FIG. 5) of the second power supply wiring 170 may be supplied to the opposite electrode 223 as. An end of the opposite electrode 223 may pass by a dummy pixel DPX and extend to the peripheral area PA. The opposite electrode 223 may contact the second shielding layer 1270 via a hole 208H in a portion of the pixel defining layer 208 that extends to the peripheral area PA. As illustrated in FIG. 8, the end of the opposite electrode 223 may extend toward an outer edge of the substrate 100 to cover at least a portion of the scan driving circuit 110.

A signal line connected to a sensing electrode may be disposed in the peripheral area PA. As illustrated in FIG. 8, the second signal lines 425-1 through 425-4 may be arranged on the peripheral area PA. At least one of the second signal lines 425-1 through 425-4 may overlap the scan driving circuit 110. The opposite electrode 223 and the first and second shielding layers 1170 and 1270 may be interposed between the scan driving circuit 110 and the second signal lines 425-1 through 425-4.

In a general display device, a signal generated in a scan driving circuit could affect signal lines of an input sensor located on a scan driving circuit. In this case, accuracy of an input sensor could be reduced. However, according to embodiments, the opposite electrode 223 covers a portion of the scan driving circuit 110. Accordingly, the impact of a signal (e.g., noise) of the scan driving circuit 110 on the second signal lines 425-1 through 425-4 may be minimized. As a comparative example, if an effort were to be made to reduce or prevent signal interference caused by a scan driving circuit and affecting signal lines using only the opposite electrode 223, the opposite electrode 223 would have to entirely cover the scan driving circuit 110. Thus, the opposite electrode 223 would have to extend farther toward an edge of the substrate 100, and in turn, the peripheral area PA, which is a dead zone, would have to be increased. As another comparative example, if an end of the opposite electrode 223 were disposed as illustrated in FIG. 8 to reduce the peripheral area PA, it could be difficult to place a signal line of the input sensor in an area RA corresponding to a portion between the end of the opposite electrode 223 and the edge of the substrate 100.

However, according to an embodiment, when the first and second shielding layers 1170 and 1270 are located between the second signal line 425-1 and the scan driving circuit 110 on the above-described area RA, an impact of a signal of the scan driving circuit 110 (e.g., noise) on the second signal line 425-1 may be prevented or minimized. Accordingly, a signal line, for example, the second signal line 425-1, may also be arranged in the above-described area RA. In addition, when the scan driving circuit 110 and signal lines are disposed by fully utilizing the peripheral area PA as described above, the peripheral area PA, which is a dead zone, may be reduced.

According to an embodiment, the first and second insulating layers 206 and 207 disposed in the peripheral area PA may respectively include valley holes 206VH and 207VH. Damage to the organic light-emitting diode OLED or the like due to penetration of external foreign matters through bulk of each of the first and second insulating layers 206 and 207 may be prevented through valley holes 206VH and 207VH. FIG. 8 illustrates that at least one dam 180 may be provided on the outer edge of the substrate 100. The dam 180 may prevent a monomer, used in a process of forming the organic encapsulation layer 320, from extending toward the end of the substrate 100, thereby reducing or preventing the formation of edge tails of the organic encapsulation layer 320. FIG. 8 illustrates a thin film encapsulation layer as the encapsulation member 300, In some implementations, the encapsulation member 300' including the sealant 310' and the encapsulation substrate 320' may be included instead of the thin film encapsulation layer as described above with reference to FIG. 3B.

FIG. 8 illustrates an arrangement of the first shielding layer 1170, the second shielding layer 1270, and the second signal lines 425-1 through 425-4 with respect to the scan driving circuit 110 as a peripheral circuit disposed in the peripheral area PA. In some implementations, a stack structure on the control driving circuit 120 illustrated in FIG. 4 may also be substantially the same as the structure illustrated in FIG. 8. For example, regarding the stack structure on the control driving circuit 120, it may be understood that the control driving circuit 120 may be arranged instead of the scan driving circuit 110 of FIG. 8. The first signal line 415-1 through 415-4 (see FIGS. 6A and 6B) or the second signal lines 425-1 through 425-4 (see FIG. 6C) may be disposed on the control driving circuit 120 to overlap with the control driving circuit 120.

Figure 10:
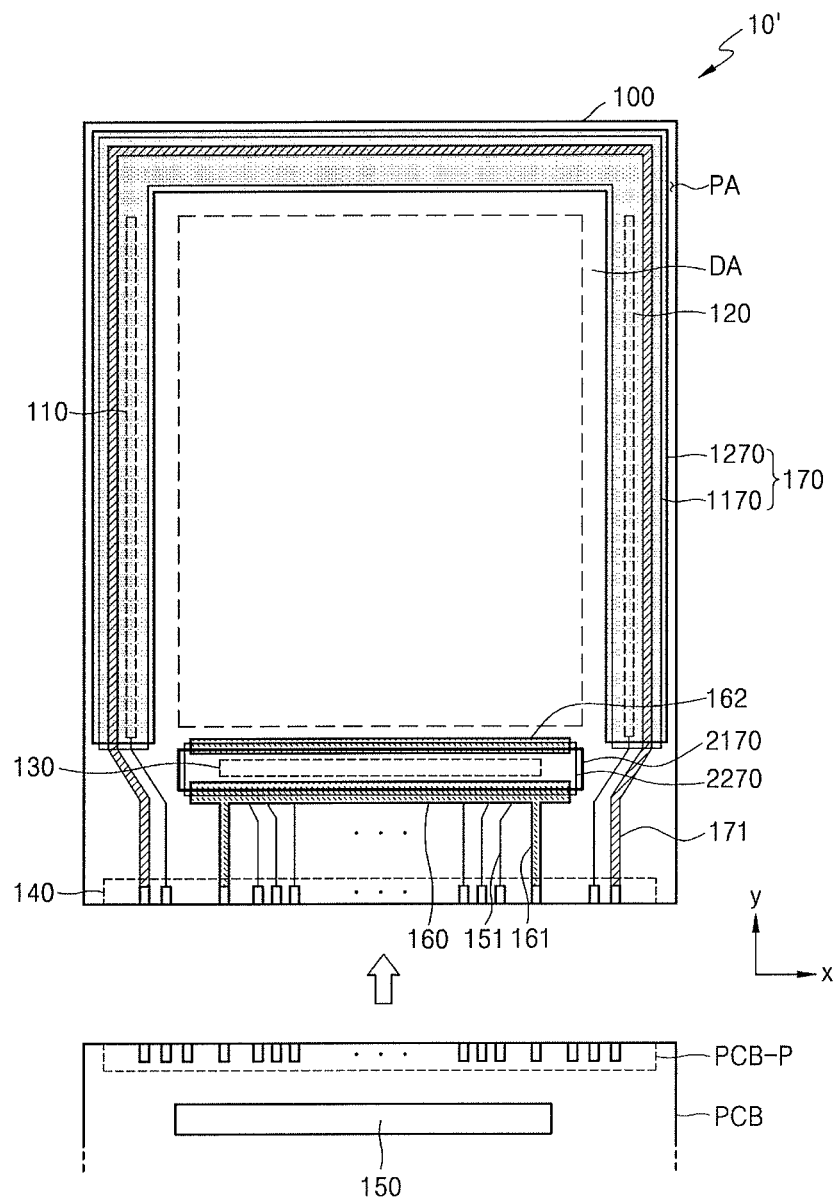
FIG. 10 illustrates a plan view schematically illustrating a display unit according to another embodiment.
Figure 11:
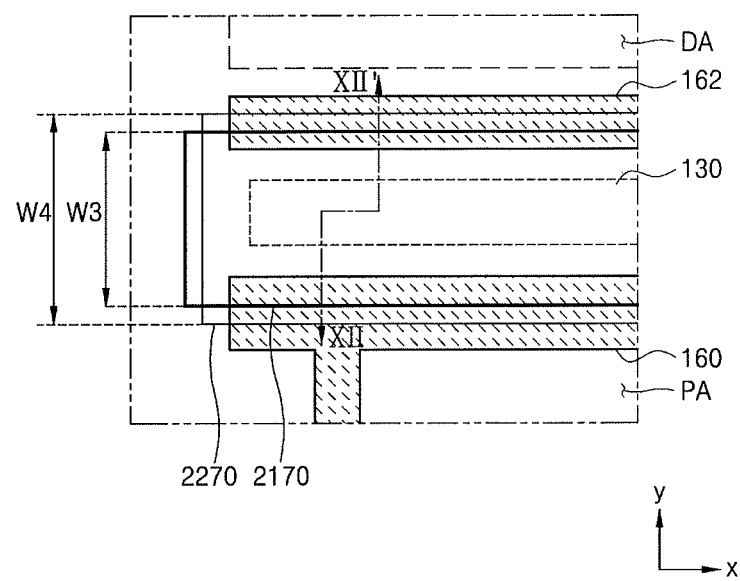
FIG. 11 illustrates a partial plan view of a switching circuit of FIG. 10 and a portion around the switching circuit.
Figure 12:
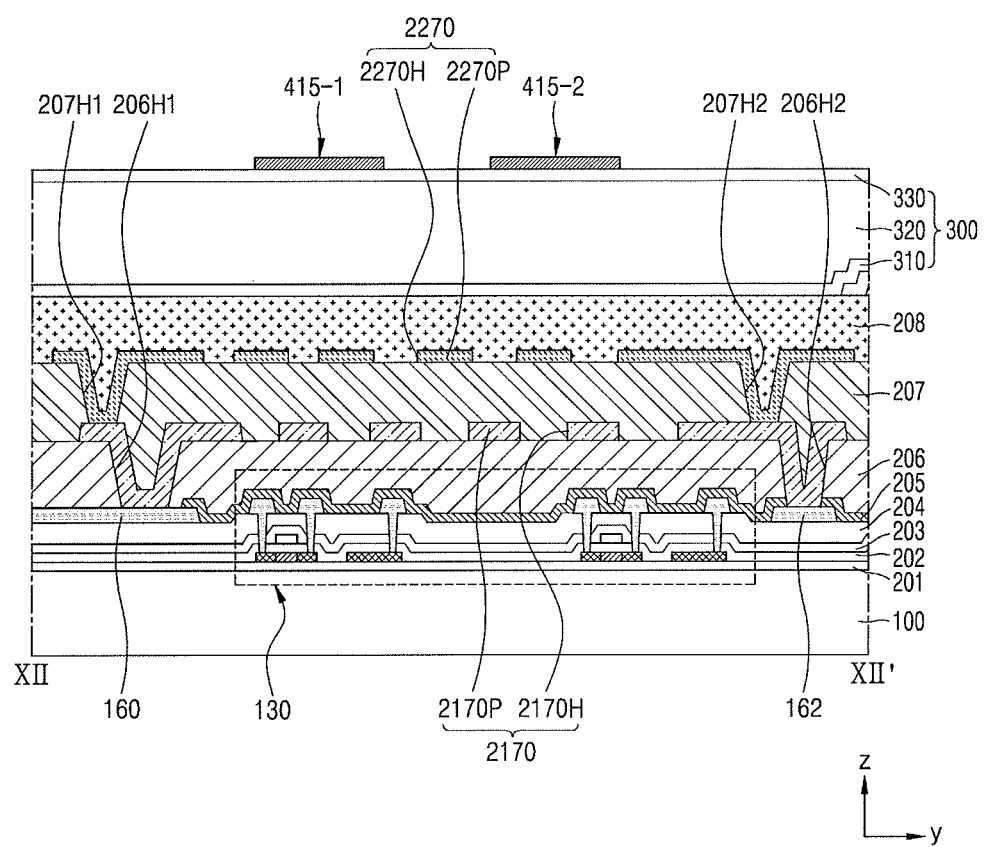
FIG. 12 illustrates a cross-sectional view illustrating a display device according to another embodiment, in which a display unit and an input sensor overlap each other.

FIG. 10 illustrates a plan view schematically depicting a display unit 10' according to another embodiment. FIG. 11 illustrates a partial plan view of a switching circuit 130 of FIG. 10 and a portion around the switching circuit 130. FIG. 12 illustrates a cross-sectional view of a display device according to another embodiment, in which a display unit and an input sensor overlap each other. FIG. 12 may correspond to a cross-section taken along line XII-XII' of FIG. 11.

The display unit 10' of FIG. 10 may be substantially the same as the display unit 10 described above with reference to FIG. 4, except that the display unit 10' further includes the switching circuit 130 as a third peripheral circuit. Thus, description will focus on the differences below.

The display unit 10' may include a switching circuit 130. The switching circuit 130 may be electrically connected to the data driving circuit 150 and a data line of a pixel. The switching circuit 130 may include a demultiplexer(s) demuxing a data signal output from the data driving circuit 150 and supplying the demuxed data signal to data lines.

The switching circuit 130 may be disposed between the third side of the display area DA and the first power supply wiring 160. For example, the switching circuit 130 may be disposed between the first power supply wiring 160 and an auxiliary power supply wiring 162. The first power supply wiring 160 and the auxiliary power supply wiring 162 may be spaced apart from each other with the switching circuit 130 therebetween.

The switching circuit 130 may overlap with a third shielding layer 2170 and a fourth shielding layer 2270 on the scan driving circuit 110. A third width W3 of the third shielding layer 2170 and a fourth width W4 of the fourth shielding layer 2270 may be each equal to or greater than a width of the switching circuit 130. The third width W3 and the fourth width W4 may be greater than the width of the switching circuit 130, as illustrated in FIG. 11.

As illustrated in FIG. 12, the third shielding layer 2170 may be disposed above the switching circuit 130 with the first insulating layer 206 therebetween, and the fourth shielding layer 2270 may be disposed above the third shielding layer 2170 with the second insulating layer 207 therebetween. As described with reference to FIG. 8, the third shielding layer 2170 may be disposed on a same layer level as and include a same material as a second driving voltage line (PL2, see FIG. 8), and the fourth shielding layer 2270 may be disposed on a same level as and include a same material as a pixel electrode (221, see FIG. 8).

At least one of the third shielding layer 2170 or the fourth shielding layer 2270 may include a hole. One shielding layer of the third and fourth shielding layers 2170 and 2270 that includes the hole may overlap the other shielding layer.

The third shielding layer 2170 may have holes 2170H and a portion 2170P having a predetermined area. The fourth shielding layer 2270 may have fourth holes 2270H and a portion 2270P having a predetermined area. Each of the third and fourth holes 2170H and 2270H may serve as an outgassing passage of the first and second insulating layers 206 and 207 disposed under the third and fourth shielding layers 2170 and 2270.

The third holes 2170H and the fourth holes 2270H may be arranged to be offset from each other. As illustrated in FIG. 12, a center of the third hole 2170H and a center of the fourth hole 2270H may be offset from each other and not coincident with each other. The third hole 2170H and the fourth hole 2270H may not overlap each other. For example, the third hole 2170H of the third shielding layer 2170 may overlap with a portion 2270P of the fourth shielding layer 2270, and the fourth hole 2270H of the fourth shielding layer 2270 overlaps with a third portion 2170P of the third shielding layer 2170. Thus, when projected in a direction perpendicular to the main surface of the substrate 100, the switching circuit 130 may be entirely covered by the third and fourth shielding layers 2170 and 2270.

The third and fourth shielding layers 2170 and 2270 may have a same voltage level. The third and fourth shielding layers 2170 and 2270 may be electrically connected to the first power supply wiring 160, as illustrated in FIG. 12. The third and fourth shielding layers 2170 and 2270 may electrically connect the first power supply wiring 160 and the auxiliary power supply wiring 162. The third shielding layer 2170 may contact the first power supply wiring 160 and the auxiliary power supply wiring 162 through a first contact hole 206H1 and a second contact hole 206H2 of the first insulating layer 206. The fourth shielding layer 2270 may contact the third shielding layer 2170 through a third contact hole 207H1 and a fourth contact hole 207H2 of the second insulating layer 207. The first power ELVDD (FIG. 5) of the first power supply wiring 160 may be supplied to driving voltage lines of a pixel connected to the auxiliary power supply wiring 162.

A signal line of the input sensor 40 may be disposed on the switching circuit 130. First signal lines 415-1 and 415-2 may be arranged on the peripheral area PA, as illustrated in FIG. 12. At least one of the first signal lines 415-1 and 415-2 may overlap the switching circuit 130. The third and fourth shielding layers 2170 and 2270 having the above-described structure may be interposed between the switching circuit 130 and the first signal lines 415-1 and 415-2. Accordingly, an undesirable impact of a signal generated in the switching circuit 130 on the first signal lines 415-1 and 415-2 may be prevented or minimized.

In some implementations, a display unit 10" may include the encapsulation member 300' described above with reference to FIG. 3B instead of a thin film encapsulation layer.

FIGS. 10 through 12 illustrate that shielding layers on the switching circuit 130, for example, the third and fourth shielding layers 2170 and 2270 are provided with a voltage corresponding to the first power ELVDD. In some implementations, shielding layers on the switching circuit 130 may be provided with a voltage corresponding to the second power ELVSS.

Figure 13:
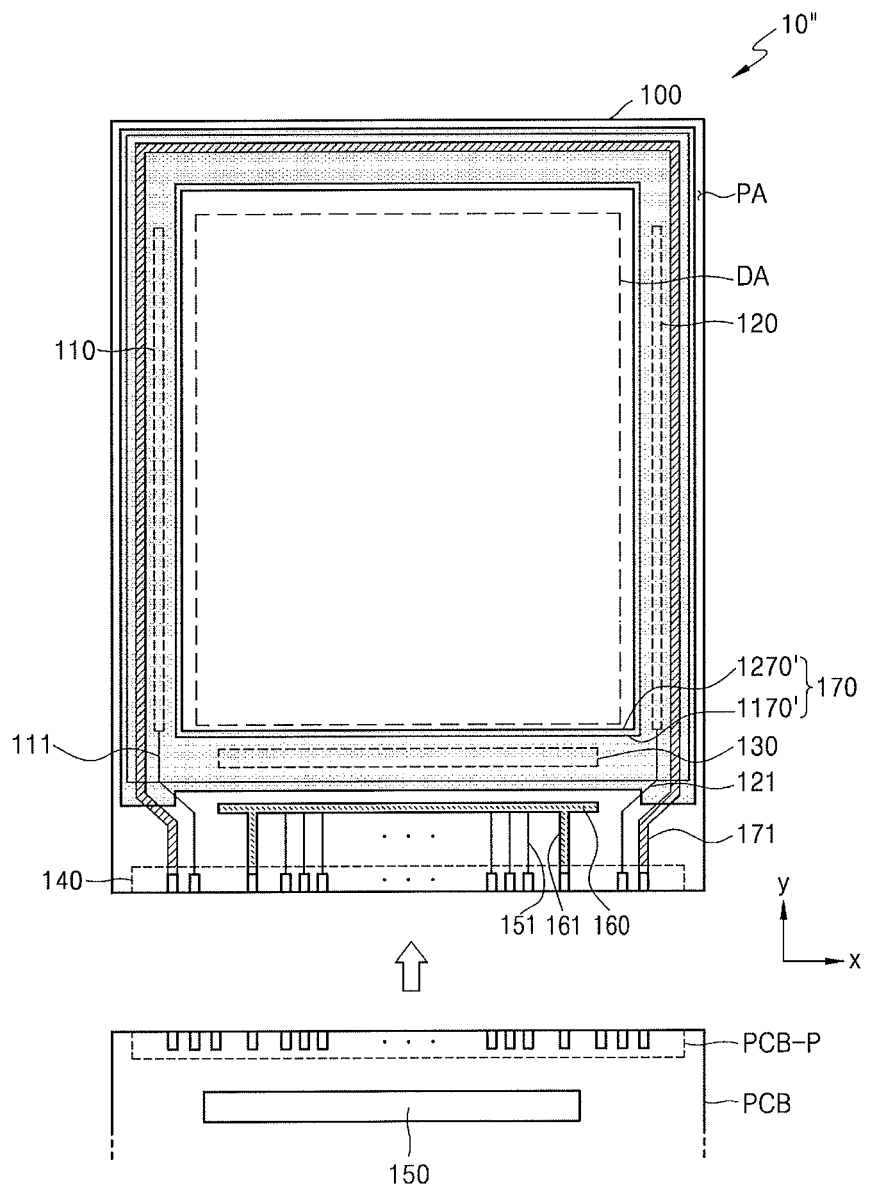
FIG. 13 illustrates a plan view schematically illustrating a display unit according to another embodiment.
Figure 14:
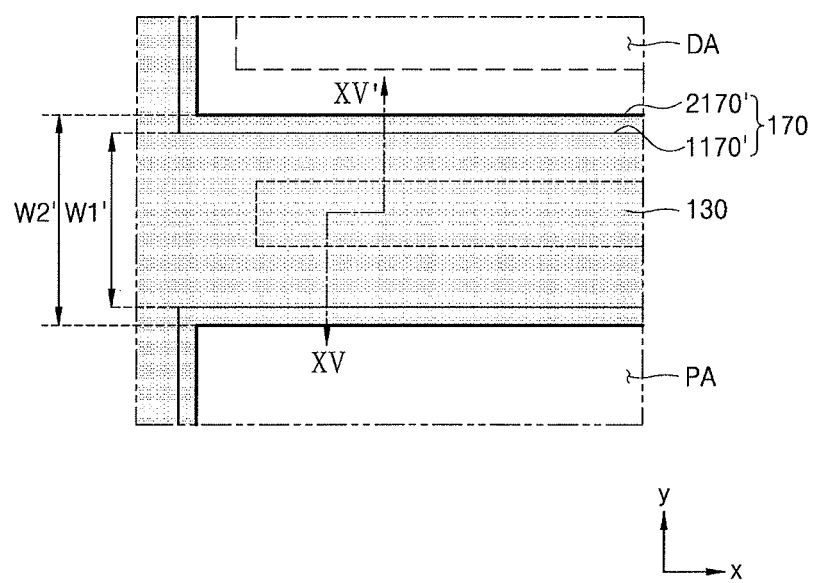
FIG. 14 illustrates a partial plan view of a switching circuit of FIG. 13 and a portion around the switching circuit.
Figure 15:
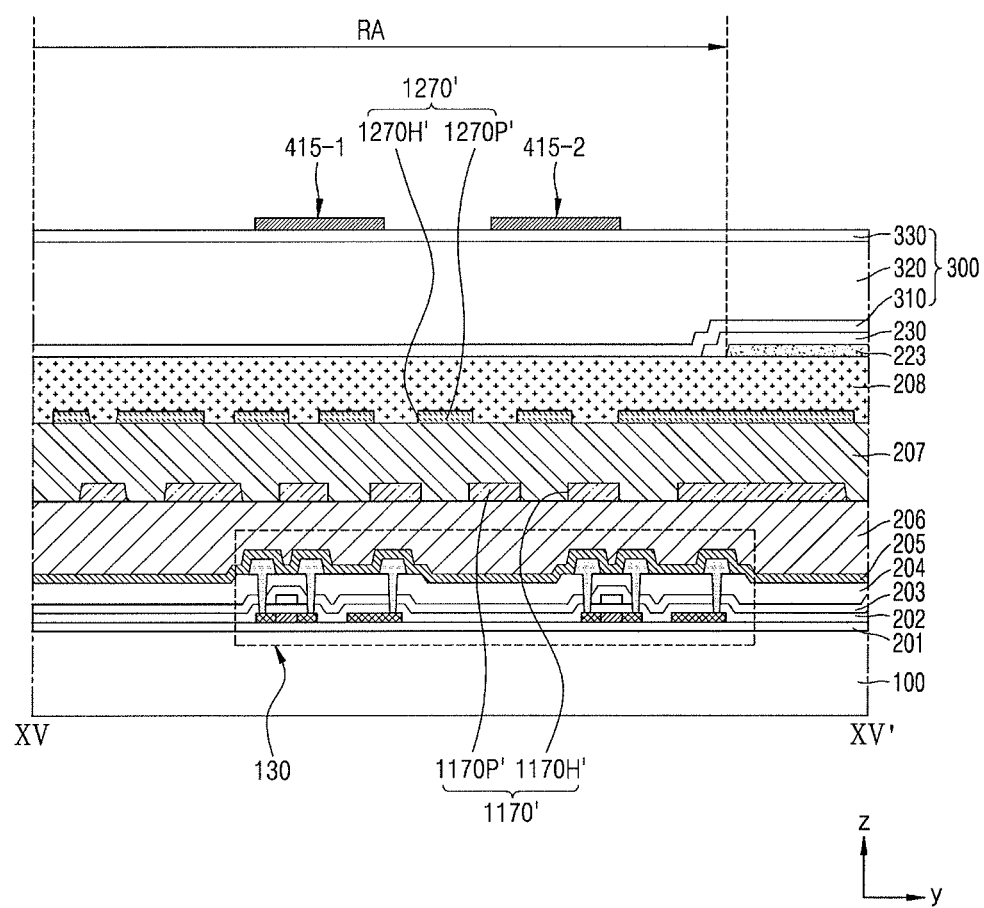
FIG. 15 illustrates a cross-sectional view illustrating a display device according to another embodiment, in which a display unit and an input sensor overlap each other.

FIG. 13 illustrates a plan view schematically illustrating a display unit 10" according to another embodiment, and FIG. 14 illustrates a partial plan view of a switching circuit 130 of FIG. 13 and a portion around the switching circuit 130. FIG. 15 illustrates a cross-sectional view illustrating a display device according to another embodiment, in which a display unit and an input sensor overlap each other. FIG. 15 corresponds to a cross-section taken along line XV-XV' of FIG. 14.

The display unit 10" of FIG. 13 further includes the switching circuit 130 as a third peripheral circuit. The display unit 10" of FIG. 13 is substantially the same as the display unit 10 described above with reference to FIG. 4, except that first and second shielding layers 1170' and 1270' extend onto the switching circuit 130 Thus, descriptions thereof will focus on the differences below.

The first and second shielding layers 1170' and 1270' may surround the display area DA entirely, as shown in FIG. 13.

For example, the first and second shielding layers 1170' and 1270' may be disposed to overlap the scan driving circuit 110, the control driving circuit 120, and the switching circuit 130. A portion of the first and second shielding layers 1170' and 1270' overlapping the scan driving circuit 110 and the control driving circuit 120 may have a structure as described with reference to FIG. 8, and thus, the description provided with reference to FIG. 8 and the like may be referred to regarding the structure. Hereinafter, overlapping between the first and second shielding layers 1170' and 1270' and the switching circuit 130 will be described.

The first and second shielding layers 1170' and 1270' may be disposed on the switching circuit 130. A first width W1' of the first shielding layer 1170' and a second width W2 'of the second shielding layer 1270', each overlapping with the switching circuit 130, may be equal to or greater than a width of the switching circuit 130. In FIG. 14, the first width W1' and the second width W2' may be greater than the width of the switching circuit 130.

As illustrated in FIG. 15, the first shielding layer 1170' may be disposed on the switching circuit 130 with the first insulating layer 206 therebetween, and the second shielding layer 1270' may be disposed on the first shielding layer 1170' with the second insulating layer 207 therebetween.

At least one of the first shielding layer 1170' or the second shielding layer 1270' may include a hole. One shielding layer of the first and second shielding layers 1170' and 1270' that includes the hole may overlap the other shielding layer.

According to an embodiment, as illustrated in FIG. 15, the first shielding layer 1170' may include first holes 1170H' and a portion 1170P' having a predetermined area, and the second shielding layer 1270' may include second holes 1270H' and a portion 1270P' having a predetermined area.

The first holes 1170H' and the second holes 1270H' may be arranged to be offset from each other. As illustrated in FIG. 15, a center of the first hole 1170H' and a center of the second hole 1270H' may be offset from each other and not coincident with each other. The first hole 1170H' and the second hole 1270H' may not overlap each other. The first hole 1170H' of the first shielding layer 1170' overlaps with the portion 1270P' of the second shielding layer 1270', and the second hole 1270H' of the second shielding layer 1270' overlaps with the portion 1170P' of the first shielding layer 1170'. Thus, when projected in a direction perpendicular to a main surface of the substrate 100, the switching circuit 130 may be entirely covered by the first and second shielding layers 1170' and 1270'.

The first and second shielding layers 1170' and 1270' may be electrically connected to the second connection wiring 171 as illustrated in FIG. 13, as described above with reference to FIGS. 4 and 8.

A signal line of the input sensor may be disposed on the switching circuit 130. In this regard, FIG. 15 illustrates first signal lines 415-1 and 415-2 arranged on the peripheral area PA. At least one of the first signal lines 415-1 and 415-2 may overlap with the switching circuit 130. The first and second shielding layers 1170' and 1270' may be interposed between the switching circuit 130 and the first signal lines 415-1 and 415-2. Accordingly, impact of a signal generated in the switching circuit 130 on the first signal lines 415-1 and 415-2 may be prevented or minimized.

A thin film encapsulation layer is illustrated as the encapsulation member 300 in FIGS. 13 through 15. In some implementations, the display unit 10" may include the encapsulation member 300' described above with reference to FIG. 3B, instead of a thin film encapsulation layer.

By way of summation and review, display devices include various circuits for providing an image. The circuits may be arranged in an area, generally referred to as a peripheral area or "dead zone" outside of the area where the image is provided.

If general effort were to be made to reduce a size of the dead zone, a circuit arranged in a dead zone of a display device might overlap with various wirings, giving rise to the possibility that the circuit arranged in the dead zone could be damaged when the circuit is exposed to external static electricity. In addition, signal interference caused the circuit and wirings could decrease the quality of the display device.

One or more embodiments include a display device that prevents damages to circuits and also signal interference with other wirings (for example, signal lines of an input sensor).

According to embodiments, damage to the display device may be prevented or minimized through outgassing of the organic insulating layer, and damage to the peripheral circuit due to static electricity or the like may be prevented or minimized, or interference of signal lines of the input sensor due to a signal of the peripheral circuit may be prevented or minimized. Accordingly, a high-quality display device may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display device, comprising:
    a substrate including a display area and a peripheral area outside the display area;
    a display element including a pixel electrode electrically connected to a thin film transistor located in the display area;
    an input sensor including sensing electrodes and signal lines, wherein
        the sensing electrodes are located in the display area, and
        the signal lines are connected to the sensing electrodes and located in the peripheral area;
    a peripheral circuit in the peripheral area; and
    a first shielding layer and a second shielding layer each located in the peripheral area, the first shielding layer and the second shielding layer being interposed between the peripheral circuit and the signal lines.

2. The display device as claimed in claim 1, further comprising a first insulating layer under the first shielding layer and a second insulating layer under the second shielding layer, wherein the second insulating layer is between the first shielding layer and the second shielding layer.

3. The display device as claimed in claim 2, wherein at least one of the first insulating layer or the second insulating layer includes an organic insulating material.

4. The display device as claimed in claim 1, wherein at least one of the first shielding layer or the second shielding layer includes a hole.

5. The display device as claimed in claim 4, wherein the hole of one shielding layer of the first shielding layer and the second shielding layer overlaps a portion of the other shielding layer.

6. The display device as claimed in claim 1, wherein
the display element further includes an opposite electrode facing the pixel electrode, and
an end of the opposite electrode extends to the peripheral area.

7. The display device as claimed in claim 6, wherein the end of the opposite electrode covers the peripheral circuit.

8. The display device as claimed in claim 6, wherein at least one of the signal lines is located in an area between the end of the opposite electrode and an outer edge of the substrate.

9. The display device as claimed in claim 1, further comprising:
a first power voltage wiring located in the peripheral area and providing first power to the thin film transistor on the display area; and
a second power voltage wiring located in the peripheral area and providing second power to the display element, the second power being different from the first power,
wherein the first shielding layer and the second shielding layer are electrically connected to the first power voltage wiring or the second power voltage wiring.

10. The display device as claimed in claim 1, further comprising an encapsulation member under the input sensor, the encapsulation member covering the display element and the peripheral circuit.

11. The display device as claimed in claim 10, wherein the encapsulation member includes at least one inorganic encapsulation layer and at least one organic encapsulation layer.

12. The display device as claimed in claim 10, wherein the encapsulation member includes a sealant surrounding the display area and an encapsulation substrate facing the substrate, the sealant being interposed between the encapsulation substrate and the substrate.

13. The display device as claimed in claim 1, further comprising at least one of a scan line, a data line, or a control line electrically connected to the thin film transistor, wherein
the peripheral circuit is electrically connected to the at least one of the scan line, the data line, and the control line.

* * * * *